United States Patent [19]
Lin et al.

[11] Patent Number: 5,216,278
[45] Date of Patent: Jun. 1, 1993

[54] SEMICONDUCTOR DEVICE HAVING A PAD ARRAY CARRIER PACKAGE

[75] Inventors: Paul T. Lin; Michael B. McShane; Howard P. Wilson, all of Austin, Tex.

[73] Assignee: Motorola, Inc., Schaumburg, Ill.

[21] Appl. No.: 841,765

[22] Filed: Mar. 2, 1992

Related U.S. Application Data

[63] Continuation of Ser. No. 622,059, Dec. 4, 1990.

[51] Int. Cl.⁵ ............... H01L 23/48; H01L 29/44; H01L 29/52; H01L 29/60
[52] U.S. Cl. ............................ 257/688; 257/673; 257/675; 257/734; 257/737; 257/773; 257/774; 174/52.4
[58] Field of Search ........... 357/68, 74, 70, 65, 357/71, 80; 174/52.4

[56] References Cited

U.S. PATENT DOCUMENTS

| | | | |
|---|---|---|---|
| 4,437,141 | 3/1984 | Prokop | 361/403 |
| 4,893,172 | 1/1990 | Matsumoto et al. | 357/79 |
| 4,954,877 | 9/1990 | Nakanishi et al. | 357/68 |
| 4,954,878 | 9/1990 | Fox et al. | 357/74 |
| 4,961,105 | 10/1990 | Yamamoto | 357/72 |
| 4,972,253 | 11/1990 | Palino et al. | 357/70 |
| 4,975,765 | 12/1990 | Ackermann et al. | 357/74 |
| 5,019,673 | 5/1991 | Juskey et al. | 174/52.2 |

OTHER PUBLICATIONS

K. Moore et al., "Solder Joint Reliability of Fine Pitch Solder Bumped Pad Array Carriers", Proceedings of the Intern'l Engineering Packaging Soc., pp. 264-274, Anaheim, Calif., Sep. 1988.

E. Stephans, "Pinless Module Connector", IBM Tech. Disc. Bull. 20, (10), Mar. 1978.

Primary Examiner—Andrew J. James
Assistant Examiner—Carl Whitehead, Jr.
Attorney, Agent, or Firm—Jasper W. Dockrey

[57] ABSTRACT

A semiconductor device (10) having first and second wiring layers (30, 33) on opposite surfaces of a carrier substrate (12) interconnected through vias (32) formed in the carrier substrate (12) electrically coupling an electronic component (18) to a mounting substrate through compliant solder balls (26) displaced away from vias (32), the semiconductor device (10) characterized by a standard size carrier substrate (12) having high performance electrical package interconnections (24) and good heat dissipation. Improved electrical performance is obtained by providing independent wiring layers (30, 33) each having a lead trace layout specifically designed for a particular electronic component (18) and a particular board connection requirement while using a standard size package outline. Assembly costs are reduced by providing a plastic package mold (36) over a standard size carrier substrate (12) capable of supporting a variety of different electronic components (18) themselves having varying dimensions.

38 Claims, 4 Drawing Sheets

# SEMICONDUCTOR DEVICE HAVING A PAD ARRAY CARRIER PACKAGE

This application is a continuation of prior application Ser. No. 07/622,059, filed Dec. 4, 1990.

CROSS REFERENCE TO RELATED MATERIAL

Related material is disclosed in co-pending, commonly assigned patent application Ser. No. 07/631,848, filed Dec. 21, 1990.

FIELD OF THE INVENTION

This invention relates in general to semiconductor devices, and more particularly to semiconductor devices having pad array carrier packages.

BACKGROUND OF THE INVENTION

In the fabrication of semiconductor devices there is an on-going need to reduce packaging costs and improve the electrical and thermal performance of the packages. Package sizing is also important especially the profile or height of the package when mounted to a printed wiring board or printed circuit board. Semiconductor manufacturers continue to develop low profile packages in order to satisfy user requirements for circuit boards having a thin profile when fully populated by semiconductor devices. Complicating the situation is the increasing complexity of electronic components such as integrated circuits which require a high package pin count to electrically connect the device to a user system.

Many of the foregoing requirements can be satisfied by a semiconductor device having a plastic pad array carrier package. The pad array carrier is a surface mount device having a low profile, high pin count and can be fabricated in plastic which offers a cost savings compared to other high pin count package materials such as ceramic and the like. Pad array carriers can address many of the current needs in device packaging but face limitations in heat dissipation. Development of improved heat dissipation characteristics and optimized package lead designs can enhance the ability of semiconductor devices having plastic pad array carrier packages to address industry requirements for low cost, high performance VLSI devices.

BRIEF SUMMARY OF THE INVENTION

In practicing the present invention there is provided a semiconductor device having a customized pad array carrier package. The design of the carrier substrate is such that a variety of electronic components having varying electrical connection requirements can be encapsulated in a standardized package body size. Overall assembly costs are low because electronic components of different sizes can be supported by a standard package body which uses the same package handling equipment during the assembly process irrespective of the size of the electronic component.

Further, the semiconductor device of the present invention offers superior electrical performance by providing a customized package interconnection layout designed to optimize the performance of the electronic component contained therein. In accordance with the invention, a carrier substrate is provided having a die attach surface opposite a package mounting surface and having a plurality of irregularly spaced vias therethrough. An electronic component having a plurality of bonding pads thereon is mounted on the die attach surface and electrically connected to a plurality of package leads extending from the die attach surface through the vias to terminal solder pads on the package mounting surface. The solder pads are displaced away from the vias and a solder ball is joined to each solder pad. A molded plastic package body overlies at least the electronic component and the electrical connections between the electronic component and the package leads.

Figure 1:
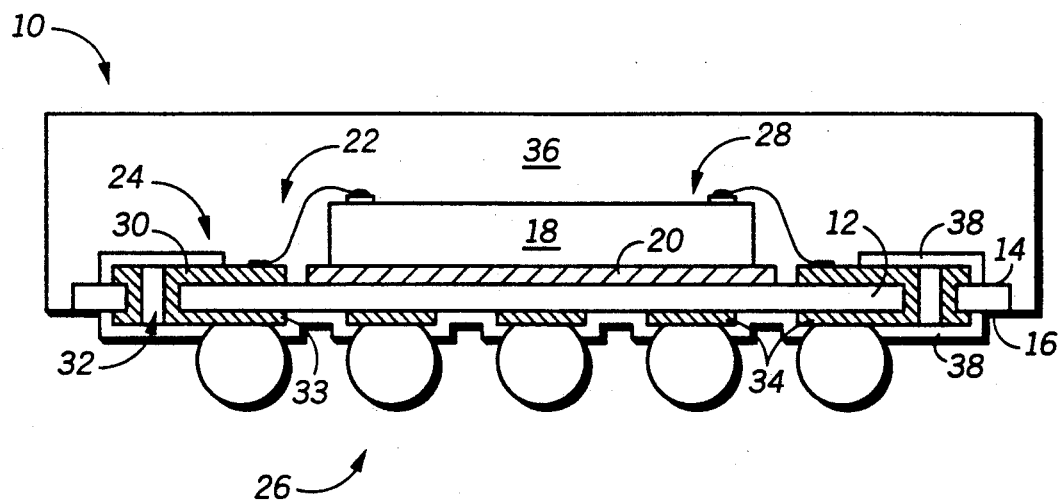
FIG. 1 illustrates, in cross section, one embodiment of a semiconductor device in accordance with the invention having a customized pad array carrier package.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION THE INVENTION

Shown in FIG. 1, in cross section, is one embodiment of a semiconductor device 10 having a standardized plastic pad array carrier package. A carrier substrate 12 having a die attach surface 14 and a package mounting surface 16 supports an electronic component 18 which is conventionally bonded to die attach surface 14 by a die bond 20. Electronic component 18 is electrically coupled to a plurality of solder balls 26 on package mounting surface 16 by electrical connections 22 and package leads 24. The package materials used in semiconductor device 10 are selected to have similar mechanical characteristics and coefficients of thermal expansion which increase the reliability of semiconductor device 10. For example, carrier substrate 12 is preferably constructed from a flexible material such as a resin material known under the trade name BT. Alternatively, other flexible materials can be used such as a glass-epoxy circuit board material identified by the generic grade FR-4, or other polymer materials such as polyimide and the like.

Solder balls 26 are formed from a lead-tin alloy having about a 60:40 lead-tin composition, or alternatively,` a lead-tin-silver alloy having about a 62:36:2 composition or an indium alloy, or the like. Solder balls 26 are somewhat resilient and can absorb mechanical stress when carrier substrate 12 is mounted to a substrate such as a printed circuit board (PCB). Furthermore, solder is a compliant material and can be shaped by application of heat and pressure to form various terminal configurations such as a barrel or alternatively an hour-glass configuration. Solder joint fatigue is a frequently encountered problem when pad array carrier packages are mounted to a PCB. This problem is minimized in the present invention by using a circuit board material to construct carrier substrate 12, which has a similar coefficient of thermal expansion as the PCB. Further, by using compliant solder balls, fatigue resistant joints can be formed connecting semiconductor device 10 to the PCB. In addition, because of their large thermal mass, solder balls 26 are capable of conducting a considerable amount of heat away from semiconductor device 10 to the mounting substrate during operation of electronic component 18. The combination of a flexible carrier substrate and compliant, thermally conductive board connection structures results in low internal package stress and good heat dissipation which increases the functional reliability of semiconductor device 10.

In FIG. 1, electrical connections 22 are bonded to a plurality of bonding pads 28 on electronic component 18 and electrically connect electronic component 18 to package leads 24. Package leads 24 include a first wiring layer 30 comprised of a plurality of patterned metal traces overlying die attach surface 14 and extending into a plurality of vias 32. Package leads 24 additionally include a second wiring layer 33 comprised of a plurality of metal lead traces overlying package mounting surface 16 and extending from vias 32 to a terminal solder pads 34 displaced away from vias 32. A molded package body 36 formed from a epoxy novalac resin, or other conventional plastic encapsulating material, extends beyond the edges of carrier substrate 12 enclosing electronic component 18, electrical connections 22, die attach surface 14 and first wiring layer 30. Solder balls 26 are aligned to solder pads 34 prior to eutectic bonding by a solder mask 38 applied to package mounting surface 16. Solder mask 38 is retained on package mounting surface 16 to improve the adhesion of solder pads 34 to carrier substrate 12 and to provide additional mounting strength for support of solder balls 26.

Figure 4:
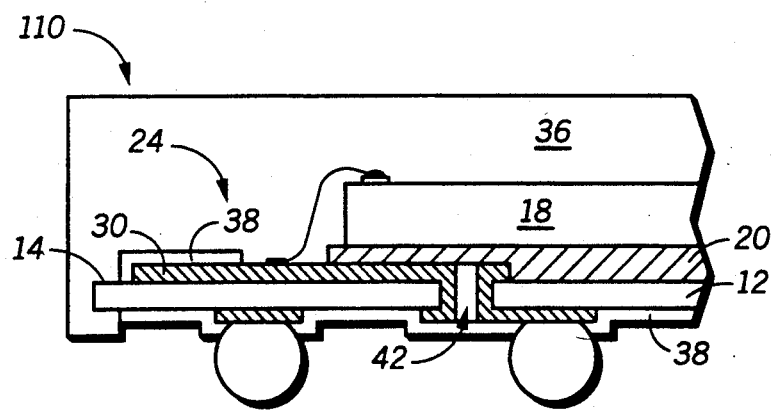
FIG. 4 illustrates, in cross section, another embodiment of a semiconductor device in accordance with the invention having internal filled vias.
Figure 5:
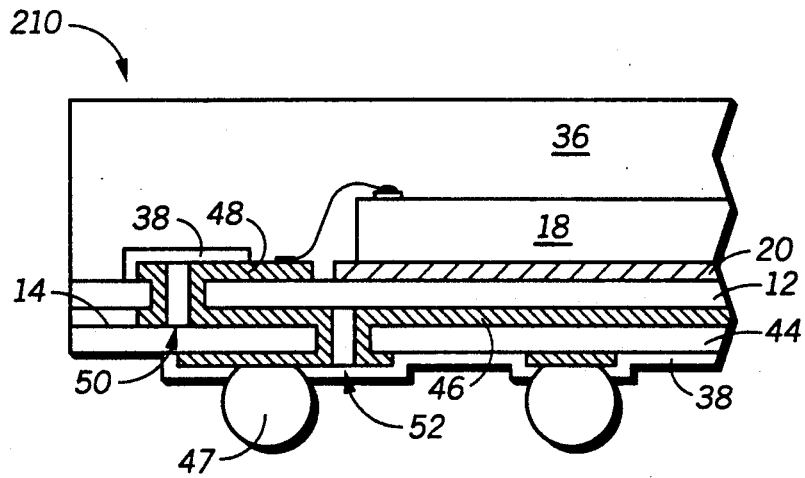
FIG. 5 illustrates, in cross section, a further embodiment of a semiconductor device in accordance with the invention having a multi-layer substrate.

In FIG. 1 package body 36 is shown extending over the edge of carrier substrate 12 which is known as overmolding. Other edge molding structures are possible and are contemplated in the present invention. For example, a wrap around edge molding is illustrated in FIG. 4, and a coincident edge molding is shown in FIG. 5. In addition, other molding techniques can also be used such as a set back package mold wherein package body 36 does not extend fully to the edge of carrier substrate 12. The overmolding of package body 36 improves the seal between package body 36 and carrier substrate 12 which assists in preventing moisture from entering the package. Given a particular edgemolding, the overall area dimensions of carrier substrate 12 are specified such that a variety of electronic components having varying sizes and electrical connection requirements can be mounted on carrier substrate 12 while maintaining the same outside package dimensions. Standardized package dimensions enable a variety of electronic components to be assembled using the same package handling equipment thus reducing overall assembly costs.

Wiring layers are formed on carrier substrate 12 by laminating sheets of copper to both die attach surface 14 and package mounting surface 16. Next, vias 32 are drilled through the laminated copper sheets and carrier substrate 12 and copper is plated to the sides of the vias. Lead traces are formed on both surfaces of carrier substrate 12 by sequentially photolithographically masking and etching the laminated copper sheets. Fabrication of lead traces on both die attach surface 14 and package mounting surface 16 enables the formation of a wide range of electrical coupling configurations between electronic component 18 and a PCB (not shown). For example, a number of different types of electronic components such as static and dynamic memory devices, standard logic devices, applications specific integrated circuits and the like having a variety of bonding pad configurations can be attached to carrier substrate 12 and bonded to a customized pattern of lead traces having a layout custom designed to provide optimal signal transmission characteristics for the particular device and bond pad configuration thereon. Further, the specific configuration of second wiring layer 33 can be designed to electrically couple electronic component 18 to lands on a PCB arranged in a regular square array, or alternatively, a customized, irregular array.

Figure 2:
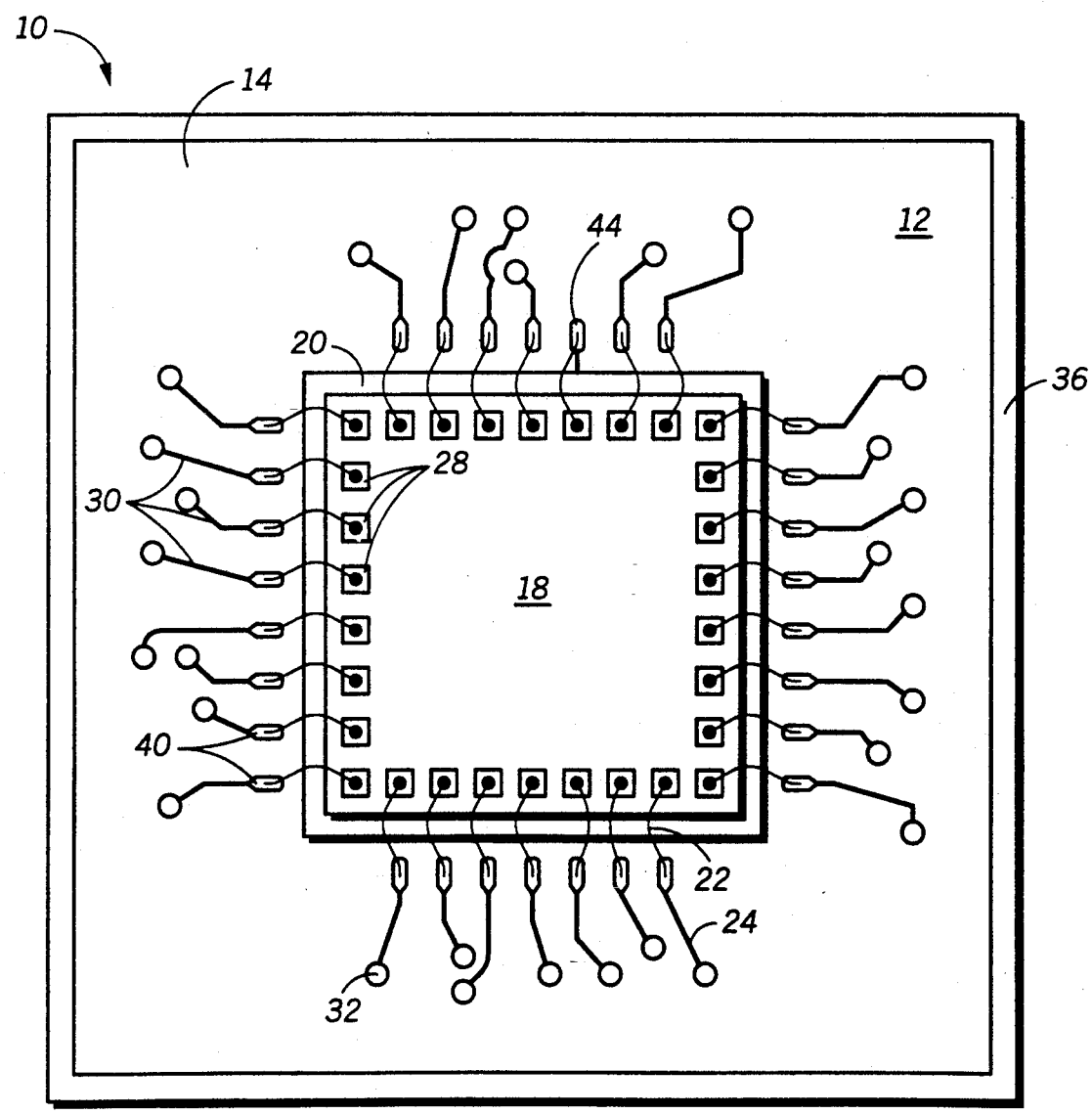
FIG. 2 is a top view of the semiconductor device illustrated in FIG. 1.
Figure 3:
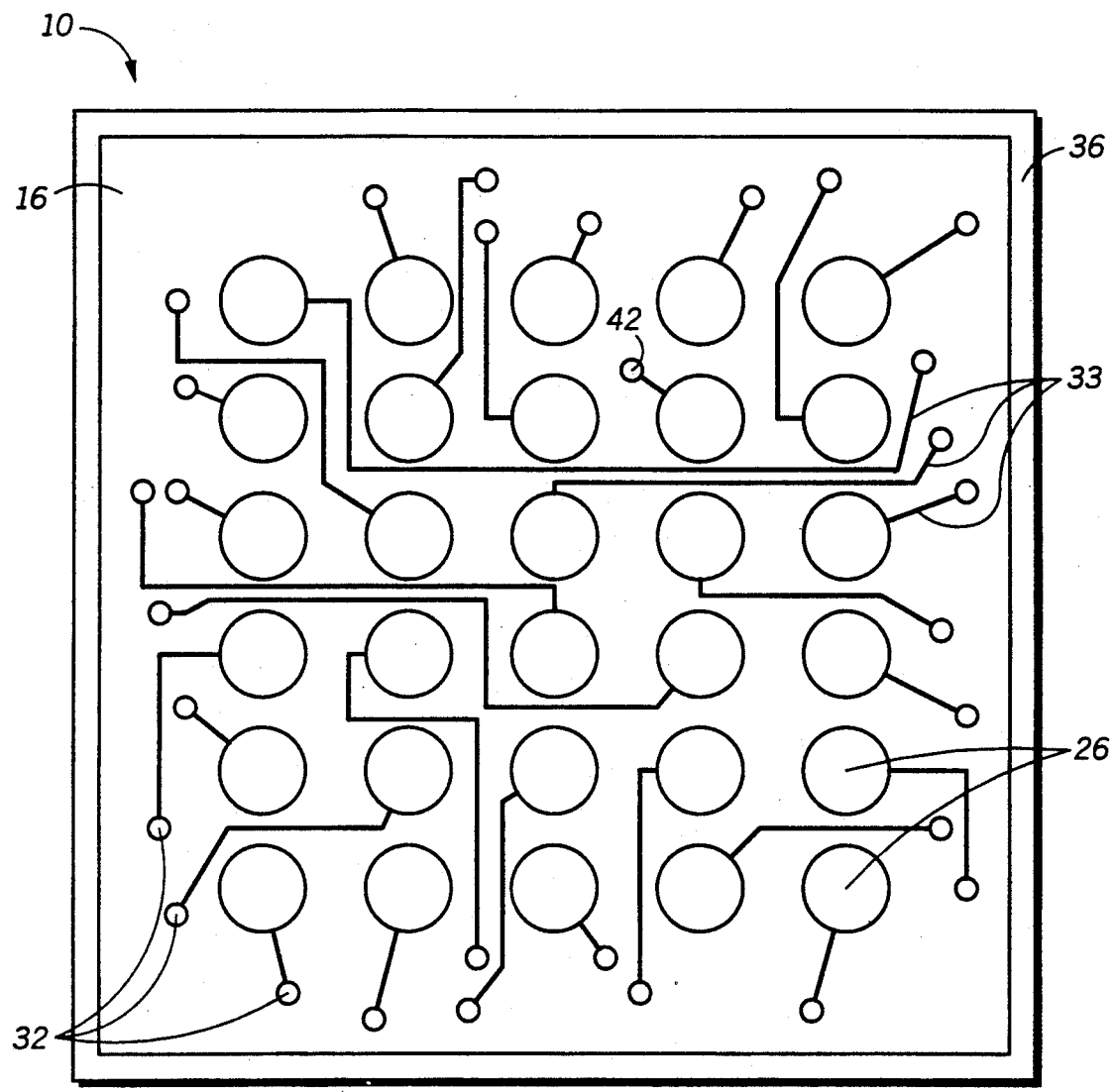
FIG. 3 is a bottom view of the semiconductor device illustrated in FIG. 1.

The customized package interconnection system of the present invention is further illustrated in the top and bottom view of semiconductor device 10 shown in FIGS. 2 and 3. An important feature of the present invention can be understood by noting that vias 32 are formed in carrier substrate 12 in any desired configuration and need not be regimented in straight rows or columns. Vias 32 can be placed in any location in carrier substrate 12 including the outside edge of carrier substrate 12. Depending upon the particular requirements of electronic component 18, maximum signal transmission rates can be achieved by using a via pattern which, for example, minimizes cross talk between adjacent signal lines or reduces signal reflection, or the like. Each of bonding pads 28 are wire bonded, or alternatively, tape bonded to an inner bonding area 40 on each lead trace in first wiring layer 30. For improved bonding yield and reliability, inner bonding areas 40 are arranged in one or more regular rows adjacent to electronic component 18. In this arrangement electrical connections 22 only span a short distance and each connection remains parallel to adjacent connections.

One possible layout of second wiring layer 33 is shown in the bottom view of FIG. 3. As illustrated, the lead traces in second wiring layer 34 can traverse across package mounting surface 16 taking a variety of possible paths terminating at a solder pad supporting one of solder balls 26. In this manner a particular bonding pad on electronic component 18 can be electrically coupled to a selected land on the surface of a PCB. Although a fully populated pad array is illustrated in FIG. 3, it is to be understood that the array can be partially depopulated and furthermore need not be a uniform array. For example, depending upon user requirements, the PCB supporting semiconductor device 10 can have an irregular arrangement of lands whose specific position on the PCB is chosen to optimize the users system performance. A custom designed solder pad array and associated lead trace layout can then be fabricated on package mounting surface 16 to match the specific land layout on the user PCB. The semiconductor device of the present invention therefore provides a standardized package body size for improved handling during device assembly combined with independently fabricated wiring layers to optimize the overall performance which includes the ability to mount semiconductor device 10 to a customized land arrangement on a user PCB.

It should be noted that solder pads 34 and solder balls 26 are, in all cases, displaced away from vias 32 on package mounting surface 16. This feature is important during the eutectic bonding of solder balls 26 to solder pads 34 where heat is applied to form the bond. If the solder balls were placed directly over the via, wicking of the solder into the via could occur. Moreover, the ability to displace solder pads 34 away from vias 32 can extend the use of a particular carrier substrate having a preformed array of vias to serve a variety of land configurations on a user PCB. The trace pattern of the photolithographic mask used to form second wiring layer 33 is simply changed to route the lead traces to match the particular land configuration on the user PCB. In this manner several different user applications can be addressed using the same carrier substrate and via configuration.

In certain applications it may be advantageous to route lead traces on die attach surface 14 under electronic component 18 to an internal via. Shown in FIG. 4, in cross section, is another embodiment of the invention wherein a semiconductor device 110 has a package leads 24 connecting electronic component 18 through an internal via 42. Die bond 20 extends onto a portion of first wiring layer 30 and is of sufficient thickness to support electronic component 18 above the plane of first wiring layer 30. The placement of internal vias such as internal via 42 in carrier substrate 12 is advantageous when a large device is mounted on die attach surface 14 and little room remains on peripheral portions of carrier substrate 12 for lead trace routing. Only an inner bonding area 44, shown in FIG. 2, is necessary to connect electronic component 18 to the lead trace in first wiring layer 30 traversing internal via 42. In the case of an especially large electronic component such as a microprocessor, all of the lead traces in first wiring layer 30 can be routed to internal vias such as internal via 42. A bottom view of internal via 42 is shown in FIG. 3 illustrating the placement of the via within, or internal to, the array of solder balls 26. Forming lead traces on die attach surface 14 which are routed under electronic component 18 to internal vias extends the utilization of a standardized package outline to large electronic component sizes including large devices having numerous electrical connection requirements.

Also illustrated in FIG. 4 is a molded package body 36 wherein the outer surface wraps around the entire edge of carrier substrate 12. The overmolding structure illustrated in FIG. 4 has the advantage of completely sealing the edge of carrier substrate 12 reducing the entry of contaminants and moisture into the package.

In cases where line noise presents a problem, separate ground and power package planes can be provided by using one or more insulating layers to separate the ground and power plans from signal lines. A further embodiment of the invention having a molded package body coextensive with the carrier substrate is illustrated in FIG. 5. A semiconductor device 210 has a second insulating layer 44, which can be a similar material to that of carrier substrate 12, or alternatively, another insulating material such as polyimide and the like. A ground plane 46 is located between carrier substrate 12 and second insulating layer 44 and is interconnected to electronic component 18 and solder ball 47 by a package interconnect 48 traversing vias 50 and 52. In the configuration shown in FIG. 5, ground plane 46 is substantially coextensive with carrier substrate 12 and can be contacted by package leads 24 from all sides of electronic component 18. Thus, the present invention is not limited to a single layer carrier substrate but can have multiple layers including layers devoted to signal transmission as well as power and ground plane functions.

Figure 6:
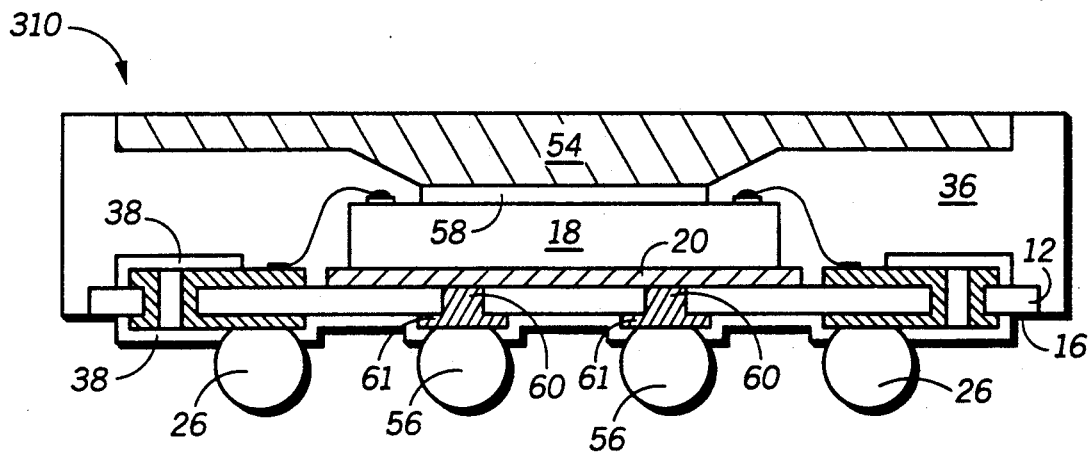
FIG. 6 illustrates, in cross section, yet another embodiment of a semiconductor device in accordance with the invention having heat transfer means.

Shown in FIG. 6 is yet another embodiment of the invention wherein a semiconductor device 310 has heat transfer means including a heat spreader 54 and thermal solder balls 56. Heat spreader 54 makes contact to a thermal coupling layer 58 overlying the face of electronic component 18 to provide heat removal from electronic element 18 to the ambient surroundings. Thermal coupling layer 58 is preferably boron-nitride filled silicone screened on the face of electronic component 18. Alternatively, thermal coupling layer 58 can be an aluminum filled silicone, aluminum nitride, a copper oxide filled silicone and the like. Thermal solder balls 56 are connected to filled vias 60 containing a thermally conductive fill material such as a metal filled epoxy or a lead-tin solder, or the like which makes contact to die bond 20. Filled vias 60 are attached to a portion of package mounting surface 16 where the array of electrically active solder balls 26 has been de-populated opening a space below electronic component 18. Heat removal from semiconductor device 310 is provide through filled vias 60 and thermal solder balls 56 to special thermal lands on a user PCB (not shown). In attaching thermal solder balls 56 to filled vias 60 the heat conduction capability of the solder balls is exploited. Solder balls such as thermal solder balls 56 can be distributed on package mounting surface 16 in a de-populated area as shown in FIG. 6, or to a variety of other locations and thermally coupled to electronic component 18 through filled vias such as filled vias 60 and heat conduits or other means. To enhance their heat dissipation capability, thermal solder balls 56 can be made large compared to electrical solder balls 26 increasing the thermal mass available for heat transfer. Further, a solder alloy having a composition yielding a large heat transfer coefficient such as a 63:37 lead-tin alloy can be used to fabricate thermal solder balls 56.

Figure 7A:
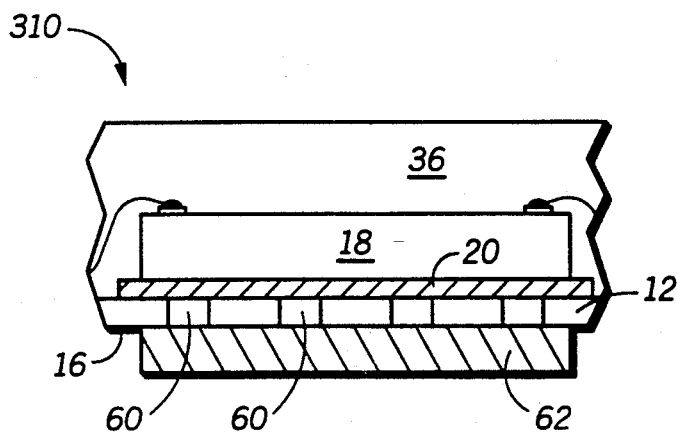
FIG. 7a illustrates, in cross section, the device shown in FIG. 6 having a thermal plate.

In the place of thermal solder balls, a thermal plate 62 can be attached to package mounting surface 16 using filled vias 60, as illustrated in FIG. 7a. Thermal plate 62 is mounted to carrier substrate 12 below electronic component 18. In the structure shown in FIG. 7a, die bond 20 and thermal plate 62 are constructed from a thermally conductive material such as copper or gold and the like and metal plated versions thereof, or a metallic alloy such as lead-tin solder, or a metal filled epoxy and the like. Heat is transferred from electronic component 18 through die bond 20, filled vias 60 and finally through thermal plate 62 to the ambient surroundings.

Figure 7B:
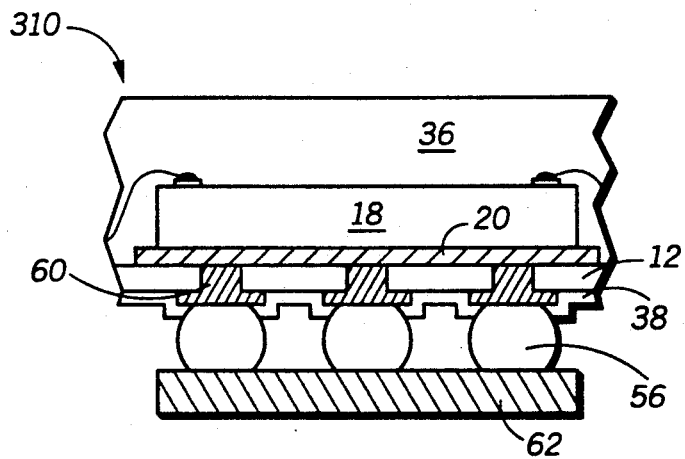
FIG. 7b illustrates, in cross section, the device shown in FIG. 6 having a thermal plate thermally coupled to the carrier substrate thermal solder balls and filled vias.

In an alternative arrangement shown in FIG. 7b, thermal plate 62 is attached to thermal solder balls 56 which in turn are supported by filled vias 60. Thermal plate 62 is thus separated from carrier substrate 12 and can be displaced away from carrier substrate 12 by a specified distance. In this configuration, thermal plate 62 can be advantageously brought into direct contact with a thermally conductive structure on the surface of a PCB.

Figure 8:
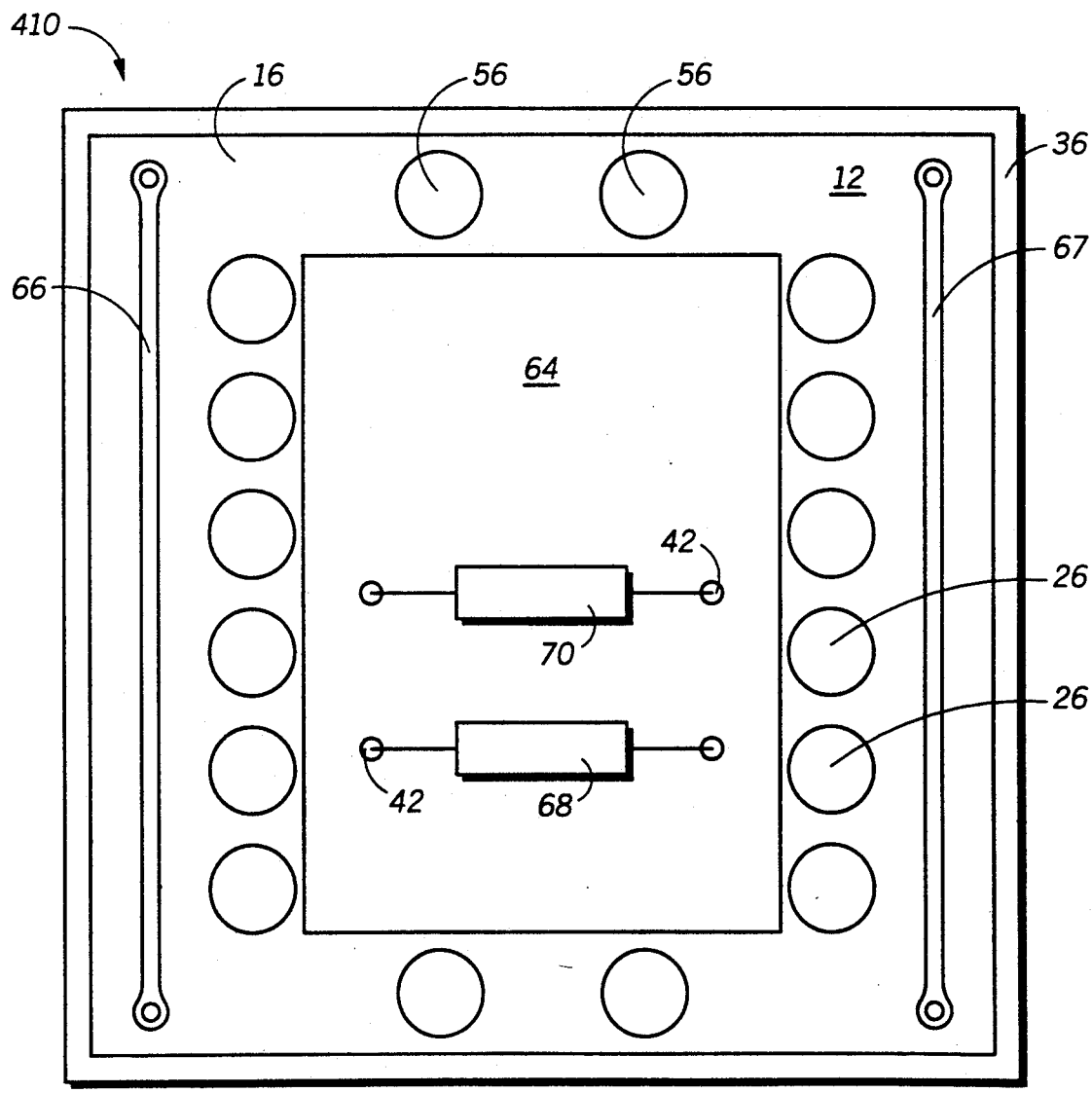
FIG. 8 is a bottom view of a semiconductor device in accordance with a still further embodiment of the invention having an external component mounting area.

In certain applications where electronic component 18 is a device having only a small requirement for lead connections such as a memory device, a depopulated area can be provided on package mounting surface 16 in which external components such as termination resistors and de-coupling capacitors and the like can be attached. Shown in FIG. 8 is a bottom view of semiconductor device 410 according to a still further embodiment of the invention having a component mounting area 64. Both electrically active solder balls 26 and thermal solder balls 56 are arrayed around the perimeter of mounting area 64 and can have a variety of different functions such as electrical connection, mechanical support and thermal conduction. Two external power busses 66 and 67 are strapped to package mounting surface 16 to provide external across chip power bussing. A decoupling capacitor 68 and a resistor 70 are mounted on component mounting area 64 and electrically coupled to electronic component 18 by package leads 24 traversing internal vias 42. This is particularly advantageous in the case of a single layer carrier substrate and where device production costs must be minimized.

Thus it is apparent that there has been provided, in accordance with the invention, a semiconductor device having an standardized pad array carrier package which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the electronic component can be surface mounted to the carrier substrate in a flip-chip configuration. Furthermore, multiple electronic components can be mounted on the carrier substrate to form a multi-chip-module. Moreover, different types of package enclosing materials such as epoxy compounds forming a glop-top covering can be used. It is therefore intended to include within the invention all such variations and modifications as fall within the scope of the appended claims and equivalents thereof.

We claim:

1. A semiconductor device having a pad array carrier package comprising:
   a carrier substrate having a die attach surface opposite a package mounting surface;
   an electronic component mounted on the die attach surface;
   a plurality of bonding pads arrayed on a face of the electronic component;
   a plurality of vias in the carrier substrate, each via located at a predetermined distance from a selected bonding pad on the electronic component, wherein the predetermined distance is variable and is chosen to minimize signal impedance through the via;
   a plurality of package leads overlying the die attach surface and extending from the die attach surface through the vias to terminal solder pads on the package mounting surface which are displaced away from the vias;
   a plurality of solder balls which are displaced away from the vias and joined to the terminal solder pads;
   electrical connections between the bonding pads on the electronic component and the package leads on the die attach surface; and
   protection means overlying at least the electronic component and the electrical connections.

2. The semiconductor device of claim 1 wherein the plurality of package leads comprises:
   a first plurality of metal lead traces overlying the die attach surface each having a bonding area adjacent to the electronic component and each extending through one of the plurality of vias; and
   a second plurality of metal lead traces overlying the package mounting surface of the substrate each extending from one of the plurality of vias to one of the plurality of terminal solder pads.

3. A semiconductor device having a plastic pad array carrier package comprising:
   an organic polymer substrate having a die attach surface and a package mounting surface;
   an electronic component mounted on the die attach surface having a plurality of bonding pads on a face thereof;
   a first plurality of lead traces on the die attach surface each having an inner bonding area adjacent to the electronic component;
   electrical connections between the bonding pads on the electronic component and the inner bonding area of the first plurality of lead traces;
   a second plurality of lead traces on the package mounting surface electrically coupled to the first plurality of lead traces by a plurality of vias in the substrate, each via located at a predetermined distance from the corresponding bonding pad such that the signal transmission through the first and second plurality of lead traces maximized;
   a plurality of terminal solder pads on the package mounting surface which are displayed away from the vias;
   a solder mask overlying the package mounting surface and a portion of the terminal solder pads; and
   protection means overlying at least the electronic component and the electrical connections.

4. The semiconductor device of claim 3 further comprising a heat spreader attached to the face of the electronic component by a thermal coupling agent.

5. The semiconductor device of claim 3 further comprising:
   a plurality of filled vias in the carrier substrate; and
   a thermal plate attached to the filled vias.

6. The semiconductor device of claim 3 further comprising:
   a plurality of filled vias in the carrier substrate; and
   a plurality of thermal solder balls attached to the filled vias.

7. The semiconductor device of claim 6 further comprising a thermal plate attached to the thermal solder balls.

8. A semiconductor device having a plastic pad array carrier package comprising:
   a carrier substrate having a die attach surface and package mounting surface, the package mounting surface including a component mounting area;
   a plurality of irregularly spaced electrical vias in the carrier substrate extending from the die attach surface to the mounting surface;
   means for attaching an external element extending from the die attach surface to the component mounting area on the package mounting surface;

an electronic component mounting on the die attach surface having a plurality of bonding pads of a face thereof;

a first plurality of lead traces on the die attach surface each having an inner bonding area adjacent to the electronic component and each extending to an individual electrical via;

electrical connections between the bonding pads on the electronic component and the inner bonding areas of the first plurality of lead traces;

a plating layer overlying a surface of the electrical vias;

a second plurality of lead traces on the package mounting surface electrically connected to the first plurality of lead traces by the plating layer and extending from the electrical vias to a plurality of regularly spaced terminal solder pads which are displaced away from the vias;

a plurality of solder balls which are displaced away from the vias and are bonded to the terminal solder pads;

a solder mask overlying the package mounting surface and a portion of the terminal solder pads; and a molded plastic package body overlying at least the electronic component and the electrical connections.

9. The semiconductor device of claim 8 wherein the means for attaching an external element comprises a plurality of filled vias.

10. The semiconductor device of claim 9 the external element comprises a plurality of thermal solder balls bonded to the filled vias.

11. The semiconductor device of claim 9 wherein the external element comprises a thermal plate attached to the filled vias.

12. The semiconductor device of claim 10 wherein the external element comprises a electrical device selected from the group consisting of a decoupling capacitor and a resistor.

13. The semiconductor device of claim 8 further comprising an external power bus attached to the package mounting surface and electrically coupled to the electronic component.

14. The semiconductor device of claim 8 wherein the carrier substrate further comprises at least one additional insulating layer and at least one conductive layer electrically coupled to the electronic component.

15. The semiconductor device of claim 1 wherein the protection means comprises an epoxy compound set back from the edge of the carrier substrate.

16. The semiconductor device of claim 1 wherein the protection means comprises a plastic mold overlying the die attach surface and extending to the edge of the carrier substrate.

17. The semiconductor device of claim 1 wherein the protection means comprises a plastic mold overlying the die attach surface and extending to the edge of the carrier substrate and wrapping around the edge of the carrier substrate to overlie and edge portion of the package mounting surface.

18. The semiconductor device of claim 1 wherein the protection means comprises an epoxy compound overlying the die attach surface and extending to the edge of the carrier substrate.

19. A semiconductor device having a pad array carrier package comprising:

a carrier substrate having a die attach surface opposite a package mounting surface, the package mounting surface partitioned in a periodic array with locations defined at selected positions in the array and terminal solder pads located at a plurality of the locations, and the die attach surface partitioned in an a-periodic array with a plurality of via holes located at positions in the a-periodic array;

an electronic component mounted on the die attach surface and having a plurality of bonding pads arrayed on a face thereof;

a first plurality of lead traces overlying the die attach surface wherein each lead trace extends from a position proximate a selected bonding pad to a predetermined via; and a second plurality of lead traces overlying the package mounting surface wherein each lead trace extends from one of the plurality of vias to a selected solder pad.

20. The semiconductor device of claim 19 further comprising protection means overlying at least the electronic component and the electrical connections.

21. The semiconductor device of claim 20 wherein the protection means comprises an epoxy compound set back from the edge of the carrier substrate.

22. The semiconductor device of claim 20 wherein the protection means comprises a plastic mold overlying the die attach surface and extending to the edge of the carrier substrate.

23. The semiconductor device of claim 20 wherein the protection means comprises a plastic mold overlying the die attach surface and extending to the edge of the carrier substrate and wrapping around the edge of the carrier substrate to overlie and edge portion of the package mounting surface.

24. The semiconductor device of claim 20 wherein the protection means comprises an epoxy compound overlying the die attach surface and extending to the edge of the carrier substrate.

25. A semiconductor device comprising:

an electronic component having a plurality of bonding pads on a face thereof;

a carrier substrate having a die attach surface opposite a package mounting surface, wherein the package mounting surface is partitioned in a periodic array with user defined locations at selected positions in the array and terminal solder pads located at a plurality of the locations;

a first plurality of lead traces overlying the die attach surface, each trace electrically connected to a selected bonding pad on the electronic component;

a second plurality of lead traces overlying the package mounting surface; and a plurality of vias in the carrier substrate electrically coupling the first and second plurality of lead traces, wherein each via is displaced away from a terminal solder pad, and wherein each via is located at a predetermined position such that the signal inductance between the bonding pad and the terminal solder pad is minimized.

26. The semiconductor device of claim 25 further comprising protection means overlying at least the electronic component and the electrical connections.

27. The semiconductor device of claim 26 wherein the protection means comprises an epoxy compound set back from the edge of the carrier substrate.

28. The semiconductor device of claim 26 wherein the protection means comprises a plastic mold overlying the die attach surface and extending to the edge of the carrier substrate.

29. The semiconductor device of claim 26 wherein the protection means comprises a plastic mold overlying the die attach surface and extending to the edge of the carrier substrate and wrapping around the edge of the carrier substrate to overlie and edge portion of the package mounting surface.

30. The semiconductor device of claim 26 wherein the protection means comprises an epoxy compound overlying the die attach surface and extending to the edge of the carrier substrate.

31. A semiconductor device having a pad array carrier package for attachment to a package mounting substrate comprising:

a flexible carrier substrate having a die attach surface opposite a package mounting surface, the substrate having a coefficient of thermal expansion substantially the same as the package mounting substrate;

an electronic component mounted on the die attach surface;

a plurality of vias in the carrier substrate, each via located at a selected position on the die attach surface, wherein the distance between the electronic component and the selected position varies such that signal transmission to and from the electronic component is optimized;

a first plurality of lead traces overlying the die attach surface, wherein each lead trace is connected to a selected via and electrically coupled to the electronic component;

an array of terminal solder pads on the package mounting surface displaced away from the vias;

a second plurality of lead traces overlying the package mounting surface, wherein each trace connects one of the plurality of terminal solder pads to one of the first plurality of lead traces through the selected via;

compliant solder balls joined to the terminal solder pads and arranged so as to align with and contact selected bonding sites on the package mounting substrate;

a moulded package body overlying at least the electronic component and a portion of the first plurality of lead traces proximate the electronic component.

32. The semiconductor device of claim 31 wherein the moulded package body comprises an epoxy compound set back from the edge of the carrier substrate.

33. The semiconductor device of claim 31 wherein the moulded package body comprises a plastic mold overlying the die attach surface and extending to the edge of the carrier substrate.

34. The semiconductor device of claim 31 wherein the moulded package body comprises a plastic mold overlying the die attach surface and extending to the edge of the carrier substrate and wrapping around the edge of the carrier substrate to overlie and edge portion of the package mounting surface.

35. A semiconductor device having a flexible pad array carrier package for mounting on a mounting substrate comprising:

a single layer substrate having a die attach surface opposite a package mounting surface, the single layer substrate having a coefficient of thermal expansion substantially the same as the mounting substrate;

a plurality of vias extending through the carrier substrate from the die attach surface to the package mounting surface;

first lead traces overlying the die attach surface, wherein each lead trace is connected to a selected via;

an electronic component mounted on the die attach surface and electrically connected to the first plurality of lead traces;

an array of terminal solder pads on the package mounting surface and displaced away from the vias;

second lead traces on the package mounting surface connected to the vias and extending to the terminal solder pads; and a moulded package body overlying at least the electronic component and a portion of the first lead traces proximate the electronic component.

36. The semiconductor device of claim 31 wherein the moulded package body comprises an epoxy compound set back from the edge of the carrier substrate.

37. The semiconductor device of claim 31 wherein the moulded package body comprises a plastic mold overlying the die attach surface and extending to the edge of the carrier substrate.

38. The semiconductor device of claim 31 wherein the moulded package body comprises a plastic mold overlying the die attach surface and extending to the edge of the carrier substrate and wrapping around the edge of the carrier substrate to overlie and edge portion of the package mounting surface.

* * * * *

UNITED STATES PATENT AND TRADEMARK OFFICE
CERTIFICATE OF CORRECTION

PATENT NO. : 5,216,278

DATED : June 1, 1993

INVENTOR(S) : Paul T. Lin et al.

It is certified that error appears in the above-identified patent and that said Letters Patent is hereby corrected as shown below:

In claim 3, column 8, line 37;
 change "displayed" to --displaced--.

Signed and Sealed this

Eleventh Day of January, 1994

Attest:

BRUCE LEHMAN

Attesting Officer

Commissioner of Patents and Trademarks